United States Patent
Li et al.

(10) Patent No.: US 6,524,969 B2
(45) Date of Patent: Feb. 25, 2003

(54) HIGH DENSITY PLASMA CHEMICAL VAPOR DEPOSITION (HDP-CVD) PROCESSING OF GALLIUM ARSENIDE WAFERS

(75) Inventors: Zhuang Li, San Jose, CA (US); Tzuyuan Yiin, San Jose, CA (US); Lung-Tien Han, San Jose, CA (US); Kent Rossman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/968,342

(22) Filed: Sep. 28, 2001

(65) Prior Publication Data

US 2002/0076939 A1 Jun. 20, 2002

Related U.S. Application Data

(60) Provisional application No. 60/238,139, filed on Oct. 5, 2000.

(51) Int. Cl.$^7$ .......................... H01L 21/20; H01L 21/36; H01L 21/31; H01L 21/469
(52) U.S. Cl. .......................... 438/767; 438/479; 438/488
(58) Field of Search .......................... 438/767, 479, 438/488

(56) References Cited

U.S. PATENT DOCUMENTS

| | | | | |
|---|---|---|---|---|
| 5,937,323 A | * | 8/1999 | Orczyk et al. | 438/624 |
| 6,095,084 A | * | 8/2000 | Shamouilian et al. | 118/723 E |
| 6,318,384 B1 | * | 11/2001 | Khan et al. | 134/22.1 |
| 6,413,871 B2 | * | 7/2002 | M'Saad | 438/692 |
| 6,451,157 B1 | * | 9/2002 | Hubacek | 156/345 |

* cited by examiner

*Primary Examiner*—Alexander Ghyka
(74) *Attorney, Agent, or Firm*—Moser, Patterson & Sheridan (57) ABSTRACT

Method for processing gallium arsenide (GaAs) wafers is provided. One embodiment of the invention provides a method for processing a substrate comprising disposing the substrate on a substrate support member in a high density plasma chemical vapor deposition chamber, depositing a film onto a surface of the substrate, and after deposition of the film, flowing a heat transfer gas in one or more channels on a substrate support surface of the substrate support member.

23 Claims, 5 Drawing Sheets

Fig. 1E

HIGH DENSITY PLASMA CHEMICAL VAPOR DEPOSITION (HDP-CVD) PROCESSING OF GALLIUM ARSENIDE WAFERS

CROSS-REFERENCE TO RELATED APPLICATIONS

This application claims benefit of United States provisional patent application Ser. No. 60/238,139, filed Oct. 5, 2000, entitled "High Density Plasma Chemical Vapor Deposition (HDP-CVD) Processing of Galium Arsenide Wafers", which is herein incorporated by reference.

BACKGROUND OF THE INVENTION

1. Field of the Invention

The present invention generally relates to substrate processing. More particularly, the present invention relates to chemical vapor deposition processing of gallium arsenide (GaAs) wafers.

2. Background of the Related Art

Gallium arsenide (GaAs) wafers or substrates are typically used for forming high speed telecommunication integrated circuits or devices. As compared to silicon substrates, GaAs substrates provide different material properties that present different challenges during material processing. For example, GaAs substrates are more insulative as semiconductor substrates than Silicon substrates. Also, GaAs substrates provides lower thermal conductivity than silicon substrates.

As interconnect and device features decrease below sub-quarter micron dimensions, high density plasma chemical vapor deposition (HDP-CVD) has proven to be one commercially acceptable method for forming films on substrates and filling sub-quarter micron features without voids. For processing of silicon substrates, HDP-CVD processes have typically provided satisfactory deposition film quality and met commercial efficiency/throughput requirements. However, typical HDP-CVD processing of GaAs substrates presents problems of wafer breakage and cracks or fractures of the deposited films on GaAs substrates. Furthermore, the quality of the deposited films have not satisfied commercial requirements. For example, films deposited on GaAs substrates generally have hazy appearance and do not provide sufficient reflectivity for other processes, such as photolithography, to be performed on the deposited film.

Therefore, there is a need for a method for processing GaAs wafers that reduces wafer breakage. There is also a need for a method for processing GaAs wafers that improves deposition film quality and reduces haze on processed wafers.

SUMMARY OF THE INVENTION

One aspect of the invention provides a method for processing GaAs wafers that reduces wafer breakage. Another aspect of the invention provides a method for processing GaAs wafers that improves deposition film quality and reduces haze on processed wafers.

One embodiment of the invention provides a method for processing a substrate comprising disposing the substrate on a substrate support member in a high density plasma chemical vapor deposition chamber, depositing a film onto a surface of the substrate, and after deposition of the film, flowing a heat transfer gas in one or more channels on a substrate support surface of the substrate support member.

Another embodiment, provides a method of processing a gallium arsenide substrate, comprising disposing the substrate on a substrate support member in a high density plasma chemical vapor deposition chamber; providing a substrate bias signal to the substrate support member; energizing an inductive plasma generator in order to couple plasma-sustaining energy into the high density plasma chemical vapor deposition chamber; and depositing a film onto a surface of the substrate in presence of a plasma. After deposition of the film, the substrate bias signal is reduced and the plasma is sustained with the energy provided by the inductive plasma generator. After reducing the substrate bias signal, a heat transfer gas is flowed in one or more channels on a substrate support surface of the substrate support member.

Still another embodiment provides a controller for a high density plasma chemical vapor deposition chamber, wherein the controller contains programming which, when executed, configures the controller to perform operations of processing a gallium arsenide substrate. The operations comprise, during a deposition cycle, providing power to a plasma generator, providing power to a substrate support member to produce a substrate bias signal, and flowing processing gases into the high density plasma chemical vapor deposition chamber. During a substrate cooling cycle following the deposition cycle, the controller is configured to reduce the power to the plasma generator while still maintaining a plasma, reduce the power to the substrate support member, and open a valve to allow a heat transfer gas to flow into at least one channel on a substrate support surface of the substrate support member.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

A method for forming a film on a substrate utilizing a chemical vapor deposition (CVD) chamber is provided. In one embodiment, a method for forming an oxide film on a gallium arsenide (GaAs) substrate is performed in a high density plasma chemical vapor deposition (HDP-CVD) chamber. An example of a HDP-CVD chamber is the Ultima™ HDP-CVD chamber available from Applied Materials, Inc. located in Santa Clara, Calif. The features of the system are generally described below. It is to be understood that while the below described HDP-CVD system is the best system known to the inventors, other systems, may also be used, or modified to be used, to advantage to accomplish the methods of the present invention.

Figure 1A:
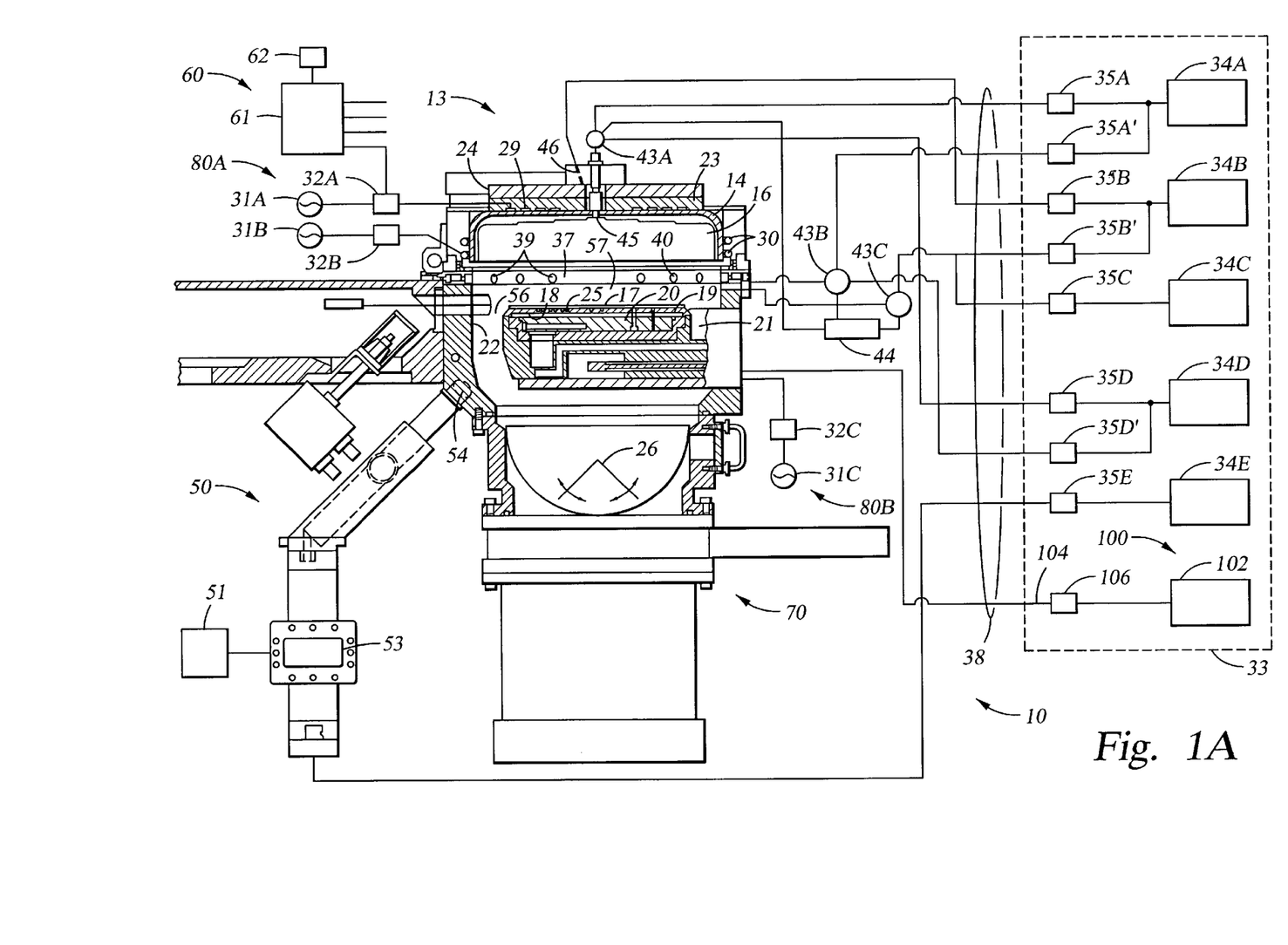
FIG. 1A is a simplified diagram of one embodiment of a high density plasma chemical vapor deposition system.
Figure 1B:
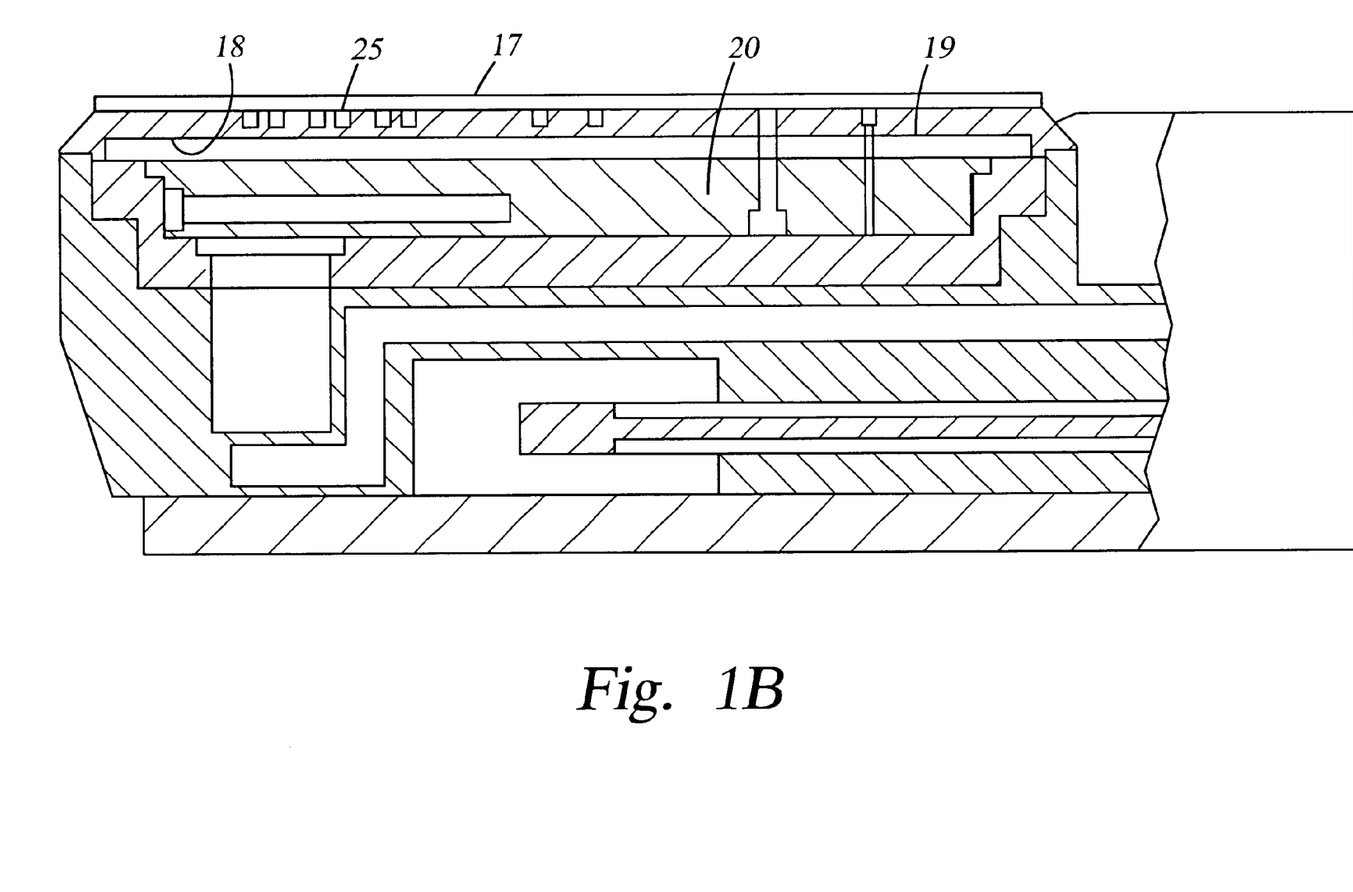
FIG. 1B is a detailed illustration of a substrate support member of the high density plasma chemical vapor deposition system shown in FIG. 1A.

FIG. 1A illustrates one embodiment of a HDP-CVD system 10 useful for depositing a film on a substrate according to the invention. FIG. 1B shows details of a substrate support member 18 of the HDP-CVD system 10. The HDP-CVD system 10 includes a chamber 13, a vacuum system 70, a source plasma system 80A, a bias plasma system 80B, a gas delivery system 33, and a remote plasma cleaning system 50.

The upper portion of chamber 13 includes a dome 14, which may be made of a dielectric material, such as alumina or aluminum nitride. The dome 14 defines an upper boundary of a plasma processing region 16. The plasma processing region 16 has a lower boundary defined by an upper surface of a substrate 17 positioned on a substrate support member 18. A heater plate 23 and a cold plate 24 may be thermally coupled to the dome 14. In one embodiment, the heater plate 23 and the cold plate 24 may control the dome temperature to within about ±10° C. over a range of about 100° C. to 200° C.

The lower portion of chamber 13 includes a body member 22, which joins the chamber to the vacuum system 70. The vacuum system 70 is connected to the body member 22 through a throttle valve 26. A base portion 21 of the substrate support member 18 is mounted on the body member 22. Substrates are transferred into and out of chamber 13 at an upper loading position 57 and moved to a lower processing position 56 in which the substrate is placed on a substrate receiving surface 19 of substrate support member 18. Substrate receiving surface 19 may comprise an electrostatic chuck (ESC) 20 that secures the substrate 17 to substrate support member 18 during substrate processing. The substrate support member 18 may include one or more sets of grooves 25 disposed on the substrate support surface 19 which are fluidly connected to a heat transfer gas system 100 (described in more detail below). In operation, a heat transfer gas may be flowed from the heat transfer gas system 100 into the one or more grooves 25 while a substrate 17 is disposed on the substrate supporting surface 19. The heat transfer gas contacts the backside of the substrate 17 and controls the temperature of the substrate 17. The one or more sets of grooves 25 may provide one or more zones of substrate temperature control. For example, one set of grooves may be disposed centrally to form an inner zone while another set of grooves may be disposed on an outer annular region of the substrate supporting surface 19 to form an outer zone.

The source plasma system 80A includes a top coil 29 and a side coil 30, mounted on dome 14. A symmetrical ground shield (not shown) may be disposed on the dome 14 to reduce electrical coupling between the coils. The top coil 29 is powered by a top source RF (SRF) generator 31A, while the side coil 30 is powered by a side SRF generator 31B, allowing independent power levels and frequencies of operation for each coil. This dual coil system allows control of the radiation density in chamber 13, thereby improving plasma uniformity. Side coil 30 and top coil 29 are typically inductively driven, which does not require a complimentary electrode. In one embodiment, the top source RF generator 31A provides up to 5,000 watts of RF power at about 2 MHz frequency and the side source RF generator 31B provides up to 5,000 watts of RF power at about 2 MHz frequency. The operating frequencies of the top and side RF generators may be offset from the nominal operating frequency (e.g., from about 1.7 to about 2.3 MHz) to improve plasma-generation efficiency.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. For example, the reflected power limit may be set at a desired percentage above an expected value of reflected power to minimize the RF control circuit from tuning the matching network and stabilize a plasma under certain conditions by holding the matching network constant.

A bias plasma system 80B is capacitively coupled to the substrate 17 through the body member 22, which act as complimentary electrodes. The bias plasma system 80B includes a bias RF (BRF) generator 31C and a bias matching network 32C. The bias plasma system 80B serves to enhance the transport of plasma species (i.e., ions) created by the source plasma system 80A to the surface of the substrate. In one embodiment, bias RF generator provides up to 5,000 watts of RF power at about 13.56 MHz.

Figure 1C:
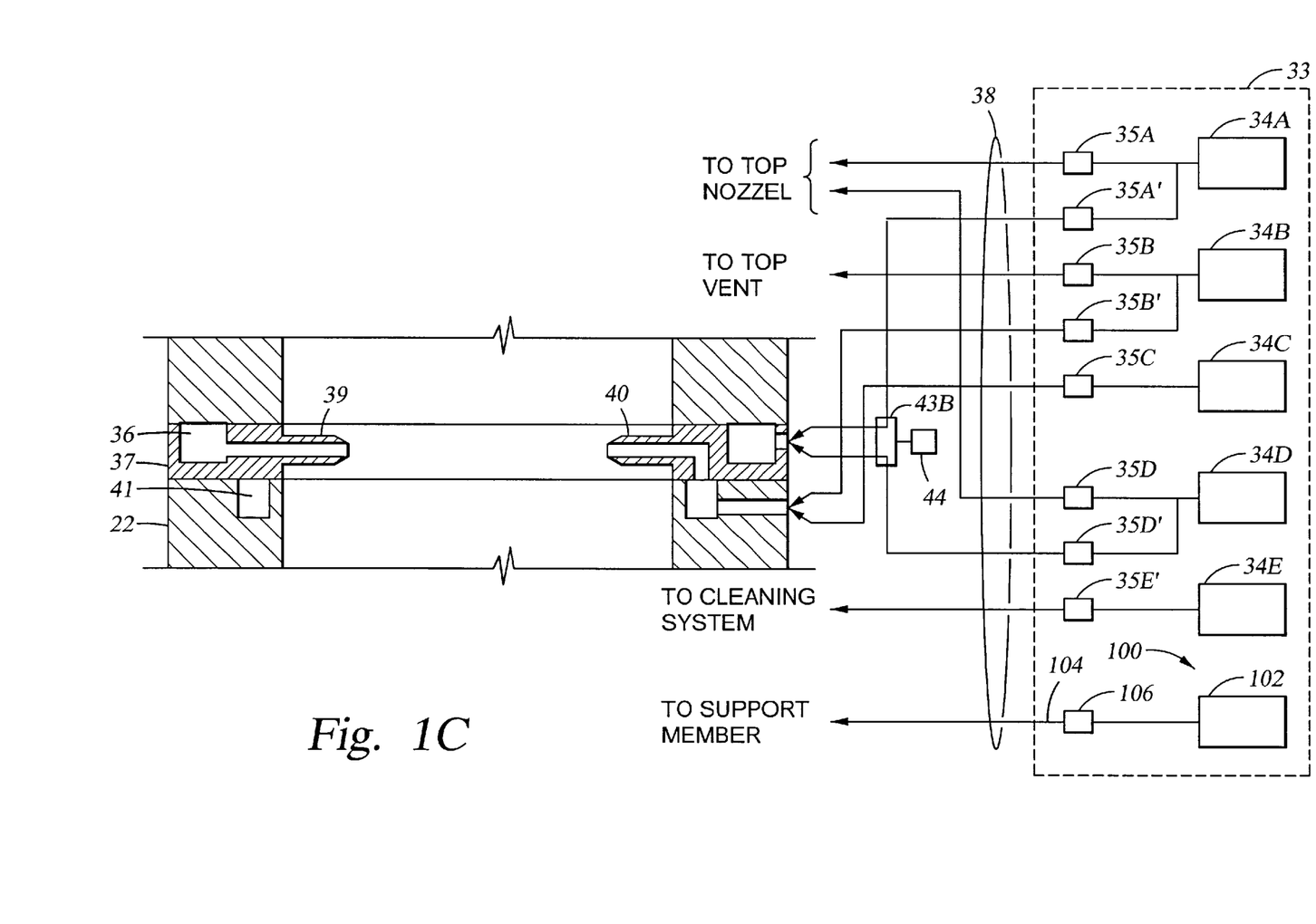
FIG. 1C is a simplified cross section of a gas ring that may be used in conjunction with the exemplary CVD processing chamber of FIG. 1A.

A gas delivery system 33 provides gases from several sources to the chamber for processing the substrate via gas delivery lines 38 (only some of which are shown). Gases are introduced into chamber 13 through a gas ring 37 and a top nozzle 45. FIG. 1C is a simplified, partial cross-sectional view of chamber 13 showing additional details of the gas ring 37. In one embodiment, first and second gas sources, 34A and 34D, and first and second gas mass flow controllers, 35A' and 35D', provide gas to a ring plenum 36 in gas ring 37 via gas delivery lines 38 (only some of which are shown). Gas ring 37 has a first plurality of source gas nozzles 39 (only one of which is shown in FIG. 1C), preferably evenly distributed along the inner surface of the gas ring 37, that provide a uniform flow of gas over the substrate during processing.

The gas ring 37 also includes a second plurality of gas nozzles 40 (only one of which is shown), which receive gas from a body plenum 41. In one embodiment, a third and a fourth gas sources, 34B and 34C, and a third and a fourth gas flow controllers, 35B' and 35C, provide gases to the body plenum 41 via gas delivery lines 38. The second plurality of source gas nozzles 40 may be co-planar with but shorter than the first plurality of source gas nozzles 39. In some embodiments, the source gases and oxidizer gases are not mixed before injecting the gases into chamber 13. In other embodiments, the source gases may be mixed prior to injecting the gases into chamber 13.

The nozzle length and the nozzle angle may be changed to tailor the uniformity profile and gas utilization efficiency for a particular process within an individual chamber. In one embodiment, the gas ring 37 provides twelve source gas nozzles (preferably six nozzles 39 and six nozzles 40 in an alternating arrangement) evenly positioned around the inner circumference of the gas ring 37.

Referring again to FIG. 1A, chamber 13 also includes top nozzle 45 and top vent 46. Top nozzle 45 and top vent 46 allow independent control of top and side flows of the gases, which improves film uniformity and allows fine adjustment of the film's deposition. Top vent 46 is an annular opening around top nozzle 45. In one embodiment, a first gas source 34A supplies a first gas to source gas nozzles 39 and top nozzle 45. Source nozzle mass flow controller (MFC) 35A' controls the amount of the first gas delivered to source gas nozzles 39, and a top nozzle MFC 35A controls the amount of the first gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed before the gases flow into chamber 13. Separate sources of the same gas may be used to supply various portions of the chamber.

In one embodiment, the gas delivery system 33 also includes a heat transfer gas system 100. The heat transfer gas system 100 comprises a gas source 102, a delivery line 104 and a MFC 106 disposed in the delivery line 104. The gas delivery line 104 is coupled at one end to the chamber 13. More specifically, the gas delivery line 104 is coupled in a manner to communicate the gas source 102 with the grooves 25. In operation, a heat transfer gas is flowed from the gas source 102 to the grooves via the delivery line 104. The rate of gas flow is controlled by the MFC 106.

A system controller 60 controls the operation of system 10. In one embodiment, the system controller 60 includes a memory 62, such as a hard disk drive, a floppy disk drive (not shown), and a card rack (not shown). The card rack may contain a single-board computer (SBC) (not shown), analog and digital input/output boards (not shown), interface boards (not shown), and stepper motor controller boards (not shown). The system controller may define board, card cage, and connector dimensions and types, and the bus structure, which may include data bus and address bus. System controller 60 operates under the control of a computer program stored on the hard disk drive or other computer programs, such as programs stored on a floppy disk. The computer program dictates, for example, the timing, mixture of gases, gas flows, temperatures, RF power levels and other parameters of a particular process. System controller 60 includes a processor 61 coupled to a memory 62 which may be a hard disk drive and/or other kinds of memory, such as ROM, PROM, and others.

The computer program code may be written in any conventional computer readable programming language, such as 68000 assembly language, C, C++, or Pascal. Suitable program code is entered into a single file, or multiple files, using a conventional text editor, and stored or embodied in a computer-usable medium, such as a memory system of the computer. If the entered code text is in a high level language, the code may be compiled, and the resultant compiler code is then linked with an object code of pre-compiled windows library routines. To execute the linked compiled object code, the system user invokes the object code, causing the computer system to load the code in memory, from which the CPU reads and executes the code to perform the tasks identified in the program.

Figure 1D:
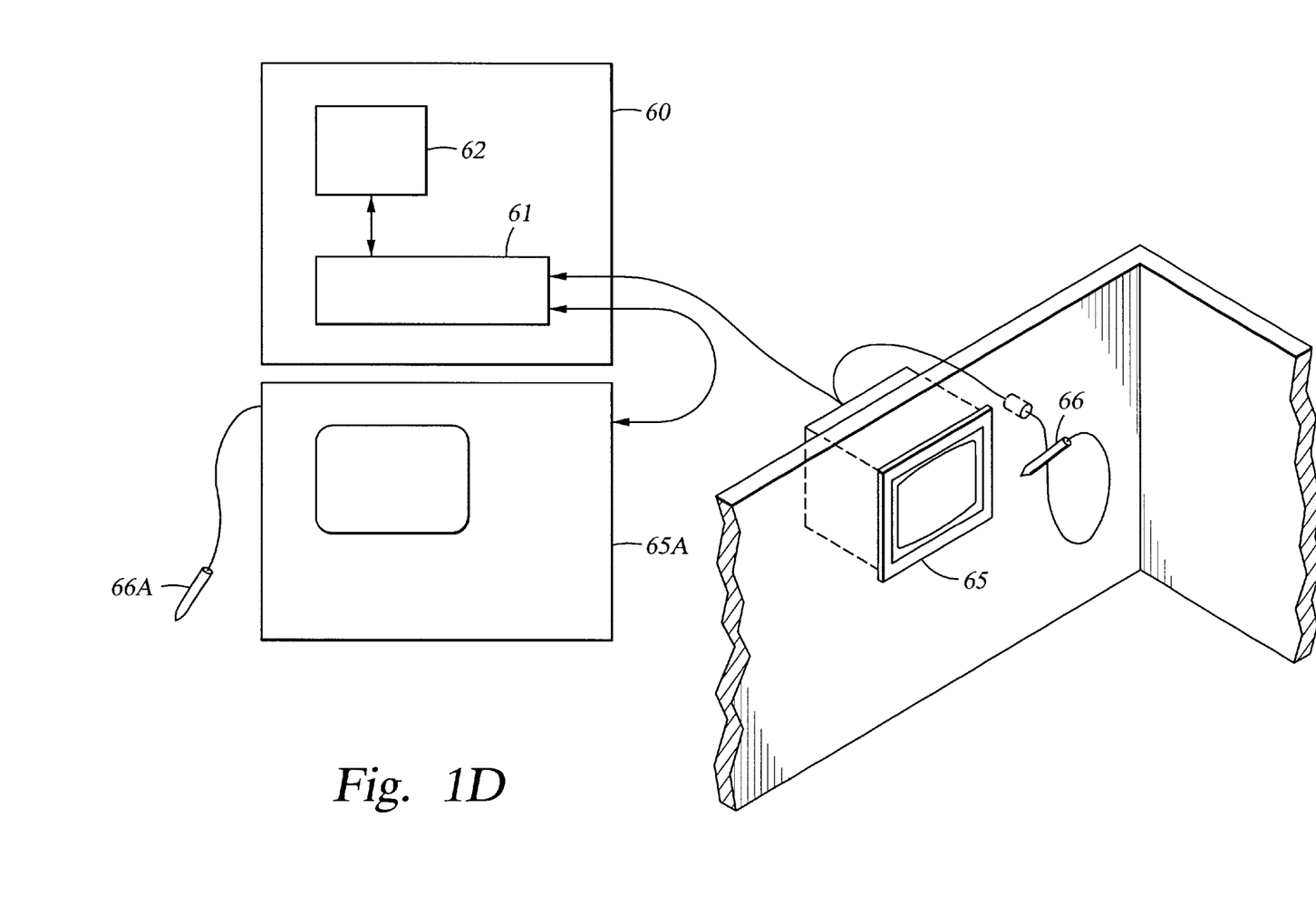
FIG. 1D is a simplified diagram of a monitor and light pen that may be used in conjunction with the exemplary CVD processing chamber of FIG. 1A.

A CRT monitor 65 and a light pen 66, as depicted in FIG. 1D, may serve as the interface between a user and the system controller. Other examples of user interfaces may include, keyboard/mouse and touch screen control monitors. In one embodiment, two monitors, 65 and 65A, are used, one mounted in the clean room wall for the operators and the other behind the wall for the service technicians. Both monitors may simultaneously display the same information. To select a particular screen or function, the operator touches an area of the display screen and pushes a button (not shown) on the pen. The touched area confirms being selected by the light pen by changing its color or displaying a new menu, for example.

Figure 1E:
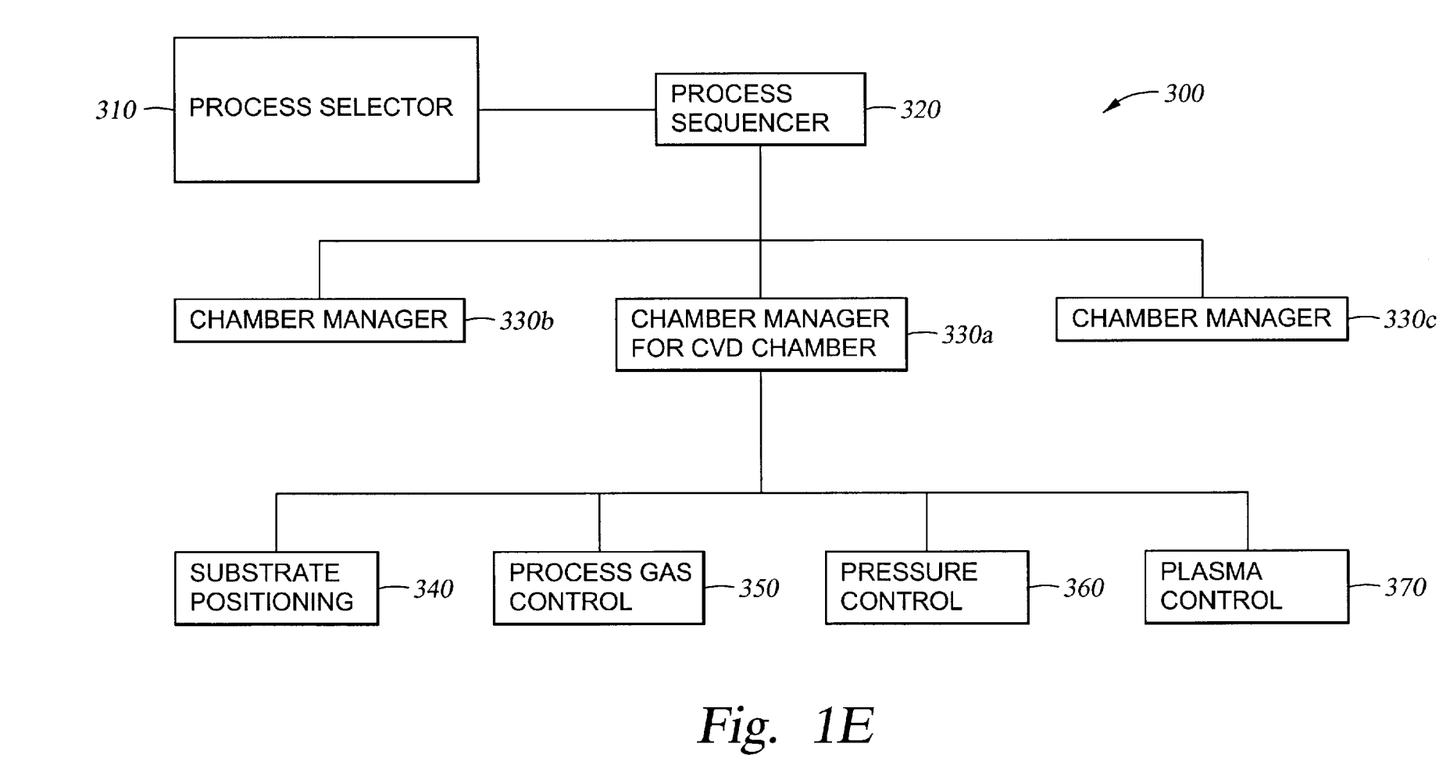
FIG. 1E is a flow chart of an exemplary process control computer program product used to control the exemplary CVD processing chamber of FIG. 1A.

FIG. 1E shows an illustrative block diagram of the hierarchical control structure of computer program 300. A user enters a process set number and process chamber number into a process selector subroutine 310 in response to menus or screens displayed on the CRT monitor 65 by using the light pen interface. Tile process sets are predetermined sets of process parameters necessary to carry out specified processes, and are identified by predefined set numbers. Process selector subroutine 310 identifies (i) the desired process chamber in a multi-chamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog input and digital input boards of the system controller and the signals for controlling the process are output on the analog output and digital output boards of system controller 60.

A process sequencer subroutine 320 comprises program code for accepting the identified process chamber and set of process parameters from the process selector subroutine 310, and for controlling operation of the various process chambers. Multiple users can enter process set numbers and process chamber numbers, or a user can enter multiple process set numbers and process chamber numbers, so sequencer subroutine 320 operates to schedule the selected processes in the desired sequence. In one embodiment, the sequencer subroutine 320 includes a program code to perform the steps of (i) monitoring the operation of the process chambers to determine if the chambers are being used, (ii) determining what processes are being carried out in the chambers being used, and (iii) executing the desired process; based on availability of a process chamber and type of process to be carried out. Conventional methods of monitoring the process chambers can be used, such as polling. When scheduling which process is to be executed, sequencer subroutine 320 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 320 determines which process chamber and process set combination is going to be executed next, sequencer subroutine 320 causes execution of the process set by passing the particular process set parameters to a chamber manager subroutine 330A–C, which controls multiple processing tasks in chamber 13 and possibly other chambers (not shown) according to tile process set determined by sequencer subroutine 320.

Examples of chamber component subroutines are substrate positioning subroutine 340, process gas control subroutine 350, pressure control subroutine 360, and plasma control subroutine 370. Those having ordinary skill in the art will recognize that other chamber control subroutines can be included depending on what processes are desired to be performed in chamber 13. In operation, chamber manager subroutine 330A selectively schedules or calls the process component subroutines in accordance with tile particular process set being executed. Scheduling by chamber manager subroutine 330A is performed in a manner similar to that used by sequencer subroutine 320 in scheduling which process chamber and process set to execute. Typically, chamber manager subroutine 330A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1E. Substrate positioning subroutine 340 comprises program code for controlling chamber components that are used to load a substrate onto substrate support number 18. Substrate positioning subroutine 340 may also control transfer of a substrate into chamber 13 from, for example, a PECVD reactor or other chambers in the multi-chamber system, after other processing has been completed.

Process gas control subroutine 350, which includes program code for controlling process gas composition and flow rates, controls the open/close position of the safety shutoff valves, and also ramps up/down the mass flow controllers to obtain the desired gas flow rates. All chamber component subroutines, including process gas control subroutine 350, are invoked by chamber manager subroutine 330A. Subroutine 350 receives process parameters from chamber manager subroutine 330A related to the desired gas flow rates. Typically, process gas control subroutine 350 operates by opening the gas supply lines, and repeatedly (i) reading the necessary mass flow controllers, (ii) comparing the readings to the desired flow rates received from chamber manager subroutine 330A, and (iii) adjusting the flow rates of the gas supply lines as necessary. Furthermore, process gas control subroutine 350 may include steps for monitoring the gas flow rates for unsafe rates, and activating the safety shut-off valves when an unsafe condition is detected.

In some processes, an inert gas, such as argon, is flowed into chamber 13 to stabilize the pressure in the chamber before reactive process gases are introduced into the chamber. For these processes, the process gas control subroutine 350 is programmed to include steps for flowing the inert gas into chamber 13 for an amount of time necessary to stabilize the pressure in the chamber before the above-described steps may then be carried out. Furthermore, the process gas control subroutine 350 may include steps for obtaining the necessary delivery gas flow rate for the desired process gas flow rate by accessing a stored table containing the necessary values for a given process gas flow rate. Once the necessary values are obtained, the delivery gas flow rate is monitored, compared to the necessary values and adjusted accordingly.

The process gas control subroutine 350 may also control the flow of heat transfer gas or a thermally conductive gas, such as helium (He), through the inner and outer passages in the substrate support member 18 (e.g., wafer chuck) with an independent helium control (IHC) subroutine (not shown). The heat transfer gas flow thermally couples the substrate 17 to the substrate support member 18. In a typical process, the substrate is heated by the plasma and the chemical reactions that form the layer, and the heat transfer gas (e.g., helium) contacts the backside surface of the substrate 17 and cools the substrate 17 through the substrate support member 18. The substrate support member 18 may also be cooled by thermal fluids (e.g., water) which flow in fluid channels inside the substrate support member. The heat transfer gas keeps the substrate below a temperature that may damage preexisting or formed features on the substrate. As discussed below, the heat transfer gas may also cool the substrate 17 after processing during a substrate cool down period.

Pressure control subroutine 360 includes program code for controlling the pressure in chamber 13 by regulating the size of the opening of throttle valve in the exhaust portion of the chamber. There are at least two basic methods of controlling the chamber with the throttle valve. The first method relies on characterizing the chamber pressure as it relates to, among other things, the total process gas flow, size of the process chamber, and pumping capacity. The first method sets throttle valve 26 to a fixed position. Setting throttle valve 26 to a fixed position may eventually result in a steady-state pressure. Alternatively, the chamber pressure may be measured, with a manometer, for example, and the throttle valve 26 position may be adjusted according to pressure control subroutine 360, assuming the control point is within the boundaries set by gas flows and exhaust capacity. The former method may result in quicker chamber pressure changes, as the measurements, comparisons and calculations associated with the latter method are not invoked. The former method may be desirable where precise control of the chamber pressure is not required, whereas the latter method may be desirable where an accurate, repeatable, and stable pressure is desired, such as during the deposition of a film layer.

When pressure control subroutine 360 is invoked, the desired or target pressure level is received as a parameter from chamber manager subroutine 330A. Pressure control subroutine 360 operates to measure the pressure in chamber 13 by reading one or more conventional pressure manometers connected to the chamber, compare the measure value (s) to the target pressure, obtain proportional, integral and differential (PID) values from a stored pressure table corresponding to the target pressure, and adjust throttle valve 26 according to the PID values obtained from the pressure table. Alternatively, pressure control subroutine 360 may open or close throttle valve 26 to a particular opening size to regulate the pressure in chamber 13 to a desired pressure or pressure range.

Plasma control subroutine 370 comprises program code for controlling the frequency and power output setting of RF generators 31A and 31B and for tuning matching networks 32A and 32B. Plasma control subroutine 370, like the previously described chamber component subroutines, is invoked by chamber manager subroutine 330A.

One embodiment of the invention provides a method for processing a substrate comprising disposing the substrate on a substrate support member in a high density plasma chemical vapor deposition chamber, depositing a film onto a surface of the substrate, and after deposition of the film, flowing a heat transfer gas in one or more channels on a substrate support surface of the substrate support member. The film may be deposited utilizing a substrate bias power less than about 1500 W. In one embodiment, an oxide film is deposited on a gallium arsenide substrate disposed in an HDP-CVD chamber utilizing a deposition-to-sputter ratio of about 3.5 to 1 (i.e., D/S=3.5) and a substrate bias power of about 1000 W. In one embodiment, the temperature of the substrate is less than about 400° C. during deposition.

After the film has been deposited on the substrate steps are taken to control the cooling of the substrate. Specifically, a heat transfer gas, such as helium, is flowed in wafer backside cooling channels on the substrate support surface for between about 15 and about 90 seconds. In one embodiment, helium is flowed in the wafer backside cooling channels for about 30 seconds. The wafer backside cooling channels may have more than one zone, for example, an inner zone and an outer zone. Thus, the zones may be maintained at the same pressure or at different pressures. In one embodiment, the pressure due to the heat transfer gas within both zones is about 4 Torr. In addition, the rate of the temperature drop is controlled to avoid fracturing the substrate. In a particular embodiment, the rate of the temperature drop is preferably no greater than 5° C./second.

In one embodiment, the rate of the temperature drop is further controlled, at least in part, by ramping down the substrate bias signal provided to the substrate support member by the bias plasma system 80B. The substrate bias signal may be completely terminated or may be reduced (e.g., by ramping down) to some predetermined level lower than a level maintained during deposition.

The rate of the temperature drop may be further controlled by controlling an inductive plasma in the chamber. Following deposition, the power provided to the source plasma system 80A is reduced (e.g., ramped down). However, sufficient energy is inductively coupled in the chamber to maintain a plasma. In one embodiment, the power provided to the source plasma system 80A is greater than about 0 W and not greater than about 5000 W. In one aspect, this effects a controlled cooling of the substrate which prevents detrimental results (e.g., fractures) attributed to excessively rapid cooling. In particular, the heat transfer gas and the inductively coupled plasma can be controlled advantageously to maintain a desired cooling rate. In a particular embodiment, the rate of the temperature drop is preferably no greater than 5° C./second.

Once the substrate reaches a transfer temperature, the substrate is removed from the processing chamber, via a robot, and transferred to another location. As defined herein, the "transfer temperature" is that temperature of the substrate when the processing chamber containing the substrate is opened to initiate removal of the substrate therefrom. Illustratively, the transfer temperature of the substrate is equal to or less than about 240° C. However, it is understood that a particular transfer temperature may be determined empirically. In general, the transfer temperature is selected to avoid damaging the substrate due to premature handling which can lead to fractures of the film, for example. In one embodiment, the substrate is transferred to a cool-down chamber for further cooling. The transfer environment may be at a sub-atmospheric pressure. For example, the substrate may be placed on a robot blade, removed from the processing chamber and transferred to a cool-down chamber via a transfer chamber maintained under vacuum. In this manner, the substrate is not exposed to ambient conditions which may result in damage to the substrate.

The substrate may be disposed on the substrate support surface of the substrate support member at a position in which a wafer orientation indicator is not aligned with a substrate support surface orientation indicator. For example, the wafer notch or flat may be rotated at about 180° from a substrate support surface flat (e.g., ESC flat). At this position, thermal stress at or adjacent the substrate orientation indicator may be reduced, resulting in substantial reduction or elimination of hairline fractures on deposited films at or adjacent the substrate orientation indicator.

EXAMPLE 1

A gallium arsenide substrate is transferred into an HDP-CVD chamber and positioned onto a substrate support member. The substrate support comprises an electrostatic chuck (i.e., ESC) having dual zone (e.g., inner/outer zones) wafer backside cooling channels on the substrate support surface. An oxide deposition process is performed utilizing a deposition to etch ratio (D/S ratio) of about 3.5 and an RF bias power of about 1000 W for about 360 seconds to form an oxide film having about 1.8 $\mu$m thickness. After the deposition process, the signals to the source plasma system 80A and the bias plasma system 80B are reduced and the substrate is cooled on the substrate support member in the presence of an inductively-coupled plasma for about 30 seconds by flowing helium gas in the dual zone wafer backside cooling channels. The helium pressure in the wafer backside cooling channels is maintained at about 4.0 Torr during the 30 second cool down period. The temperature after deposition is about 400° C. and the temperature after cooling is about 250° C. The cool down rate is preferably no greater than 5° C./second. The substrate did not break during substrate transfer out of the chamber. The deposition rate and the deposited film property, such as refractive index and film uniformity, met or exceeded commercial requirement. Sub-quarter micron features were filled without voids.

EXAMPLE 2

The same process as described above in Example 1 is performed on a GaAs substrate, except that the substrate is rotated 180° to position the substrate orientation indicator (e.g., wafer notch or flat) opposite of the position of the ESC flat. The deposited film exhibited similar results as the results of Example 1. Furthermore, the deposited film showed no hairline fractures adjacent the substrate orientation indicator.

While the foregoing is directed to the preferred embodiment of the present invention, other and further embodiments of the invention may be devised without departing from the basic scope thereof. The scope of the invention is determined by the claims which follow.

What is claimed is:

1. A method of processing a gallium arsenide substrate, comprising:

disposing the substrate on a substrate support member in a high density plasma chemical vapor deposition chamber;

depositing a film onto a surface of the substrate; and after deposition of the film, flowing a heat transfer gas in one or more channels on a substrate support surface of the substrate support member while maintaining a plasma in the high density plasma chemical vapor deposition chamber.

2. The method of claim 1 wherein the heat transfer gas is flowed for about 30 to 90 seconds.

3. The method of claim 1 wherein the film is deposited utilizing a substrate bias power less than about 1500 W.

4. The method of claim 1 wherein the film is deposited utilizing a deposition-to-sputter ratio of about 3.5 to 1.

5. The method of claim 1 wherein a heat transfer gas pressure in the one or more channels on the substrate support surface is between about 2 Torr and 8 Torr.

6. The method of claim 1 wherein the substrate is disposed on a substrate support surface of the substrate support member at a position which a wafer orientation indicator is not aligned with a substrate support surface orientation indicator.

7. The method of claim 1 wherein a temperature of the substrate is maintained below 400° C.

8. The method of claim 1 wherein a decreasing rate of temperature change of the substrate while flowing the heat transfer gas is not greater than 5° C./second.

9. The method of claim 1, further comprising:

providing a substrate bias signal to the substrate support member while depositing the film; and reducing the substrate bias signal before flowing the heat transfer gas.

10. The method of claim 9 wherein an inductive plasma generator power is between 1 W and 5000 W.

11. The method of claim 9 wherein the substrate bias signal has a substrate bias power less than about 1500 W.

12. A method of processing a gallium arsenide substrate, comprising:

disposing the substrate on a substrate support member in a high density plasma chemical vapor deposition chamber;

providing a substrate bias signal to the substrate support member;

energizing an inductive plasma generator in order to couple plasma-sustaining energy into the high density plasma chemical vapor deposition chamber;

depositing a film onto a surface of the substrate in presence of a plasma;

after deposition of the film, reducing the substrate bias signal and sustaining the plasma with the energy provided by the inductive plasma generator; and after reducing the substrate bias signal, flowing a heat transfer gas in one or more channels on a substrate support surface of the substrate support member.

13. The method of claim 12 wherein the substrate is disposed on a substrate support surface of the substrate support member at a position which a wafer orientation indicator is not aligned with a substrate support surface orientation indicator.

14. The method of claim 12 wherein a temperature of the substrate is maintained below 400° C.

15. The method of claim 12 wherein the substrate bias signal has a substrate bias power less than about 1500 W.

16. The method of claim 12 wherein the heat transfer gas is flowed for about 30 to 90 seconds and wherein a heat transfer gas pressure in the one or more channels on the substrate support surface is at about 2 Torr to about 8 Torr.

17. The method of claim 12 wherein a decreasing rate of temperature change of the substrate while flowing the heat transfer gas is not greater than 5° C./second.

18. The method of claim 17 wherein a temperature of the substrate is maintained below 400° C.

19. The method of claim 17 wherein the substrate bias signal has a substrate bias power less than about 1500 W.

20. The method of claim 17 wherein the heat transfer gas is flowed for about 30 to 90 seconds and wherein a heat transfer gas pressure in the one or more channels on the substrate support surface is at about 2 Torr to about 8 Torr.

21. The method of claim 20 wherein the substrate bias signal has a substrate bias power less than about 1500 W.

22. The method of claim 12 further comprising, after a predetermined time, moving the substrate to a cool down chamber.

23. The method of claim 22 wherein the substrate is at a temperature not greater than about 240° C. when moving the substrate to the cool down chamber.

* * * * *

UNITED STATES PATENT AND TRADEMARK OFFICE
CERTIFICATE OF CORRECTION

PATENT NO. : 6,524,969 B2  
DATED : February 25, 2003  
INVENTOR(S) : Li et al.

It is certified that error appears in the above-identified patent and that said Letters Patent is hereby corrected as shown below:

Column 6,  
Line 9, please change "Tile" to -- The --.  
Line 59, please change "tile" to -- the --.

Column 7,  
Line 2, please change "tile" to -- the --.

Signed and Sealed this

Twelfth Day of August, 2003

JAMES E. ROGAN  
*Director of the United States Patent and Trademark Office*